United States Patent [19]

Wu

[11] Patent Number: 5,294,754

[45] Date of Patent: Mar. 15, 1994

[54] DIRECT WRITE EC SINGLE METAL LAYER

[75] Inventor: Leon L. Wu, Hopewell Junction, N.Y.

[73] Assignee: Iternational Business Machines Corporation, Armonk, N.Y.

[21] Appl. No.: 996,461

[22] Filed: Dec. 24, 1992

[51] Int. Cl.$^5$ ............................................. H05K 1/11
[52] U.S. Cl. ..................... 174/255; 174/250; 361/767; 361/774
[58] Field of Search ............... 174/250, 251, 255, 260, 174/264, 262; 361/401, 403, 404, 406, 414, 413

[56] References Cited

U.S. PATENT DOCUMENTS

| | | | |
|---|---|---|---|
| 4,225,900 | 9/1980 | Ciccio et al. | 361/403 X |
| 4,254,445 | 3/1981 | Ho | 361/392 |
| 4,414,741 | 11/1983 | Holt | 174/261 X |
| 4,453,176 | 6/1984 | Chance et al. | 357/51 |
| 4,467,400 | 8/1984 | Stopper | 174/261 X |
| 4,489,364 | 12/1984 | Chance et al. | 361/395 |
| 4,546,413 | 10/1985 | Feinberg et al. | 361/410 |
| 4,549,200 | 10/1985 | Ecker et al. | 357/80 |
| 4,560,963 | 12/1985 | Barrow | 174/261 X |
| 4,746,815 | 5/1988 | Bhatia et al. | 307/303 |
| 4,840,924 | 6/1989 | Kinbara | 437/189 |
| 5,136,471 | 8/1992 | Inasaka | 174/261 X |

Primary Examiner—Leo P. Picard
Assistant Examiner—L. Thomas
Attorney, Agent, or Firm—Whitham & Marhoefer

[57] ABSTRACT

A direct write and laser delete system for making engineering changes in which top surface metal C4 pads each has a small satellite pad connected to it by a short connecting line that is deleted if an engineering change is to be made. Vias connect the satellite pads to a "personality" wiring layer in the module. A top surface grid of line segments allows any C4 pad to be connected to a point outside the chip boundary by means of one or more short direct write lines. There is one global X and Y engineering change grid on respective X and Y thin-film layers and another global X and Y engineering change grid on respective X and Y multi-layer ceramic module layers. All of these varied patterns are connected to lines with each chip pitch boundary where direct write connections can be made, and a grid line can be interrupted by a laser deletion of a top surface metal line.

5 Claims, 5 Drawing Sheets

DIRECT WRITE EC SINGLE METAL LAYER

BACKGROUND OF THE INVENTION

1. Field of the Invention

This invention relates to improved engineering change metallization patterns for multi-chip, multi-layer modules, and more particularly to a set of lines and patterns that facilitate forming new networks to execute desired engineering changes by direct write metal process steps.

2. Description of the Prior Art

As explained in co-pending application Ser. No. 06/771,707 filed Oct. 4,1991, and assigned to the assignee of this application, the formation of integrated circuit chips in accordance with different technologies has been known for a number of years. A demand for increased complexity of electronic systems including such integrated circuit chips has caused the development of multi-chip modules including a plurality of integrated circuit chips. Such modules are necessary when the desired circuitry must be integrated on chips of such differing technologies that formation on a single chip is impossible or economically disadvantageous or where the circuit complexity and device counts are too large to be integrated on a single chip consistent with good chip production yields.

Such multi-chip modules (MCM) usually take the form of relatively large, multi-layer constructions having a surface on which a plurality of chips may be mounted. The multi-layer construction is similar to multi-layer circuit boards in that wiring can be run in a direction parallel to the surface at the interface between any two layers. Wiring can be run perpendicular to the surface and between wiring layers with through-holes or "vias" in the layers which are selectively filled with conductive materials. Multi-chip modules have been implemented with a variety of technologies including multi-layered co-fired ceramics, silicon based thin film structures, ceramic based thin film structures and combinations of those techniques.

However, because of the multi-layer construction, there is no access to wiring other than on the surface of the multi-layer structure. Therefore, engineering changes cannot readily be made. Perhaps of equal importance is the fact that while electronic modules are large relative to the chips they contain, they are often very complex and of fairly small overall dimensions. Therefore, they are subject to connector defects in the same manner as the chips to be mounted thereon and manufacturing yields of the multi-layer structure must also be considered. The length of the conductors is quite substantial because complex wiring metallization must be provided to allow each output terminal of one chip to be connected to a plurality of other input terminals on other chips. Additionally, so-called fan-out wiring is often provided to interface between the fine wiring patterns characteristic of the connector spacing of the chips and the relatively more coarse wiring patterns on the MCM.

Since such structures are complex and require a number of processing steps for each layer, substantial expense is involved in fabrication of the multi-layer structure. It is therefore economically important that the multi-layer structures be repairable. It is similarly important that engineering design changes be possible. In the past, this has been accomplished by a process known as "ECing", or the implementing of engineering changes, which required providing one or more layers of redistribution wiring from the chip I/O pads to EC pads on the top surface of the Multi-layer structure. The signal connection is then made by wiring from EC pad to EC pad and by redistribution wiring formed in the multi-layer structure from EC pad to chip I/O pad. However, these layers of redistribution wiring are also subject to the same potential defects as other wiring layers and are not repairable. Further, such patterns of redistribution wiring are in close proximity to each other, requiring high line (e.g. wiring pattern) quality, and a parasitic capacitance will exist causing signal delays, reduced noise margins, and other effects, thereby posing a severe restriction on wiring design rules. Additionally, to function for facilitating a wide variety of repair and engineering changes, hereinafter referred to collectively as engineering changes (EC), a significant amount of product and process complexity is required. This function also traditionally requires additional area for the redistribution wiring and EC pads, thus limiting the maximum possible density of the MCM. This, of course, also limits the performance of the MCM both operationally, from the number of ICs which can be included, and functionally due to delays, noise, etc., associated with longer wiring and parasitic capacitances.

As examples of prior art wiring schemes which allow some degree of repairs and engineering changes to be made, U.S. Pat. No. 4,489,364 to Chance et al shows an electronic circuit module in which connections to pads to which chips are connected are buried within the body of the multi-layer structure but are periodically brought to the surface of the module and linked by EC pads of a so-called "dog-bone" shape. Continuity of these connections may be broken by severing the narrow portion of the dog-bone and EC connections may be made thereto either with or without severing the original connection. However, if a defect occurs in or better the C4 pad and the first EC pad, no repair is possible and the module must be discarded. The wiring through via holes is particularly vulnerable to the occurrence of discontinuities, as well, which may or may not be repairable and, in any event, repair would require point-to-point wiring over a considerable distance, further increasing parasitic capacitance of the overall wiring system. It can also be readily appreciated that the length of wiring involved in this scheme, including the repeated vertical traversals of the multi-layer structure through vias, is large and has a large lumped capacitance.

Additionally, U.S. Pat. No. 4,746,815 to Bhatia et al provides a switching circuit within the module to allow sharing of EC pads between receiver and driver circuits. U.S. Pat. No. 4,652,974 to Ryan, particularly at FIGS. 1 and 6, shows the complexity of the prior art redistribution wiring layers. U.S. Pat. No. 4,453,176 to Chance et al shows wiring to capacitances buried within the multi-layer structure. U.S. Pat. No. 4,840,924 to Kinbara shows a particular structure for the dog-bone EC pads. U.S. Pat. No. 4,254,445 to Ho shows a staggered chip location arrangement for a large number of chips in a module to minimize potential wiring crossovers to maximize the number of EC pads which can be provided. U.S. Pat. No. 4,549,200 to Ecker et al shows a repairable multi-level overlay system using redistribution. U.S. Pat. No. 4,546,413 to Feinberg et al shows a module structure in which EC pads are provided on both major surfaces of the multi-layer structure. U.S. Pat. No. 4,706,165 to Takenaka et al shows a multi-layer structure in which connections to module connection pins are made through vias to EC pads at the upper surface of the module to increase the types of engineering changes and repairs which can be made.

SUMMARY OF THE INVENTION

An object of this invention is the provision of a direct write system for making engineering changes in a multi-chip, multi-layer module that provides flexibility in reconfiguring a new connection network in an area of congested defects.

Another object of this invention is the provision of a direct write system for making engineering changes that requires only a small portion of the top surface metal and only a fraction of a reference plane in order to make a new connection network.

Briefly, this invention contemplates a direct write and laser delete system for making engineering changes in which top surface metal C4 pads each has a small satellite pad connected to it by a short connecting line that is deleted if an engineering change is to be made. Vias connect the satellite pads to a "personality" wiring layer in the module. A top surface grid of line segments allows any C4 pad to be connected to a point outside the chip boundary by means of one or more short direct write lines. There is one global X and Y engineering change grid on respective X and Y thin-film layers and another global X and Y engineering change grid on respective X and Y multi-layer ceramic module layers. All of these varied patterns are connected to lines with each chip pitch boundary where direct write connections can be made, and a grid line can be interrupted by a laser deletion of a top surface metal line.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
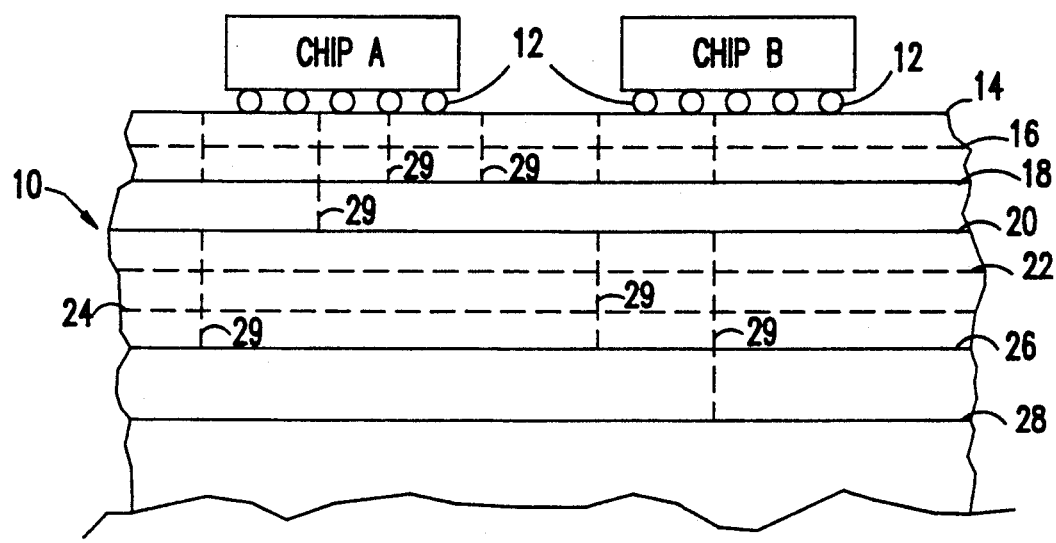
FIG. 1 is a schematic sectional view of a portion of a multi-layer module.

Referring now to the drawings, and more particularly to FIG. 1, it shows in cross-section an upper portion of a hybrid wiring module indicated by the general reference numeral 10. The module illustrated is a conventional multi-layer ceramic (MLC) module comprised of a plurality of metallized layers in a ceramic body. A number of integrated circuit chips, such as chip A and chip B, are electrically and mechanically connected by suitable means, such as solder balls 12, to so-called C4 pads that make up a part of a top surface metal layer 14 on the top surface of the module.

Within the module itself, the second layer 16 is a top reference plane wiring pattern for an X thin-film wiring pattern 18 and Y thin-film wiring pattern 20 in the third and fourth layers, respectively. The fifth layer is a bottom reference plane wiring pattern 22 for the thin-film wiring patterns 18 and 20. Next, the sixth layer is a mesh conductive pattern 24 and the seventh and eighth layers are respectively an X MLC wiring layer 26 and a Y MLC wiring layer 28. The vertical dotted lines 29 in FIG. 1 represent via chains connecting various points on the top surface metal layer 14 to various points on layers 18, 20, 26 and 28. As will be explained, engineering change networks, in accordance with the teachings of this invention, use a portion of the top surface metal layer 14, a portion of the thin-film signal layers 18 and 20 and a portion of the MLC layers 26 and 28.

Figure 2:
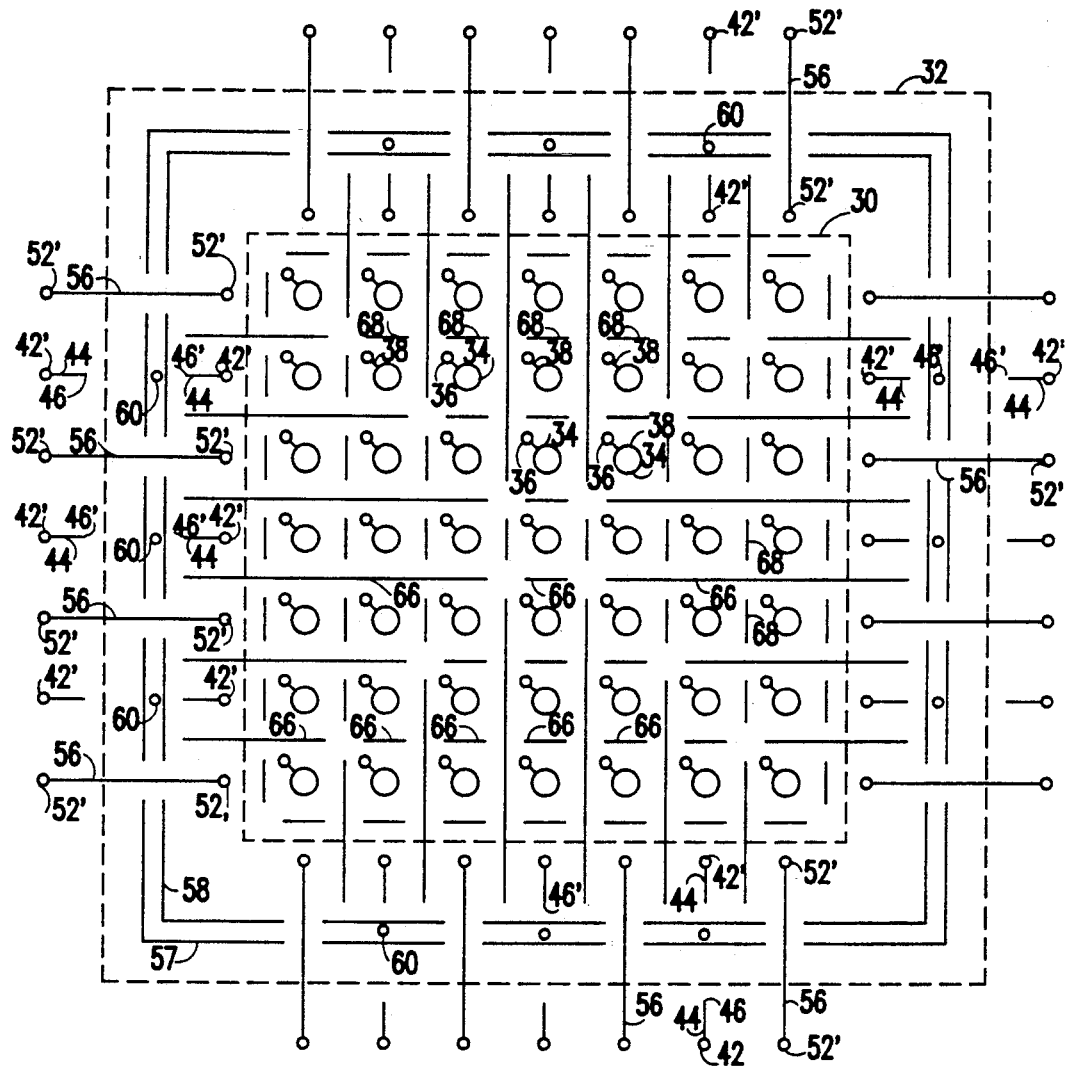
FIG. 2 is a plan view of a portion of a top surface metal layer of a multi-layer module in accordance with the teachings of this invention.

Referring now to FIG. 2, it shows a plan view of the top surface metal layer 14. The inner dotted line 30 denotes the chip boundary and the outer dashed line 32 denotes the chip pitch boundary. Circular pads 34 (so-called C4 pads), to which a chip is electrically and mechanically connected to the module by solder balls 12, are arranged in a regular pattern of rows and columns; in FIG. 2 the vertical columns are designated as the Y direction and the horizontal rows are designated as the X direction.

Closely adjacent to and associated with each of the pads 34 is a small satellite pad 36 attached to its associated pad by a narrow, laser deleteable line 38. For clarity of visual presentation, reference numerals 34, 36 and 38 have been applied to all of the corresponding elements in FIG. 2. Vias (not shown) connect each of the small satellite pads 36 to either a MLC wiring layer 26 or 28 or, alternatively, to a thin-film personality wiring layer 18 or 20 in accordance with the planned interconnection desired for a particular pad 34 in the absence of an engineering change. The line 38 is deleted between a particular pad 34 and its associated satellite pad 36 in the event it is desired to make a change in the wiring to the particular pad.

As mentioned above, part of the engineering global change wiring is located on the thin-film wiring layers 18 and 20 and part is located on the multi-layer ceramic layers 26 and 28.

Figure 3:
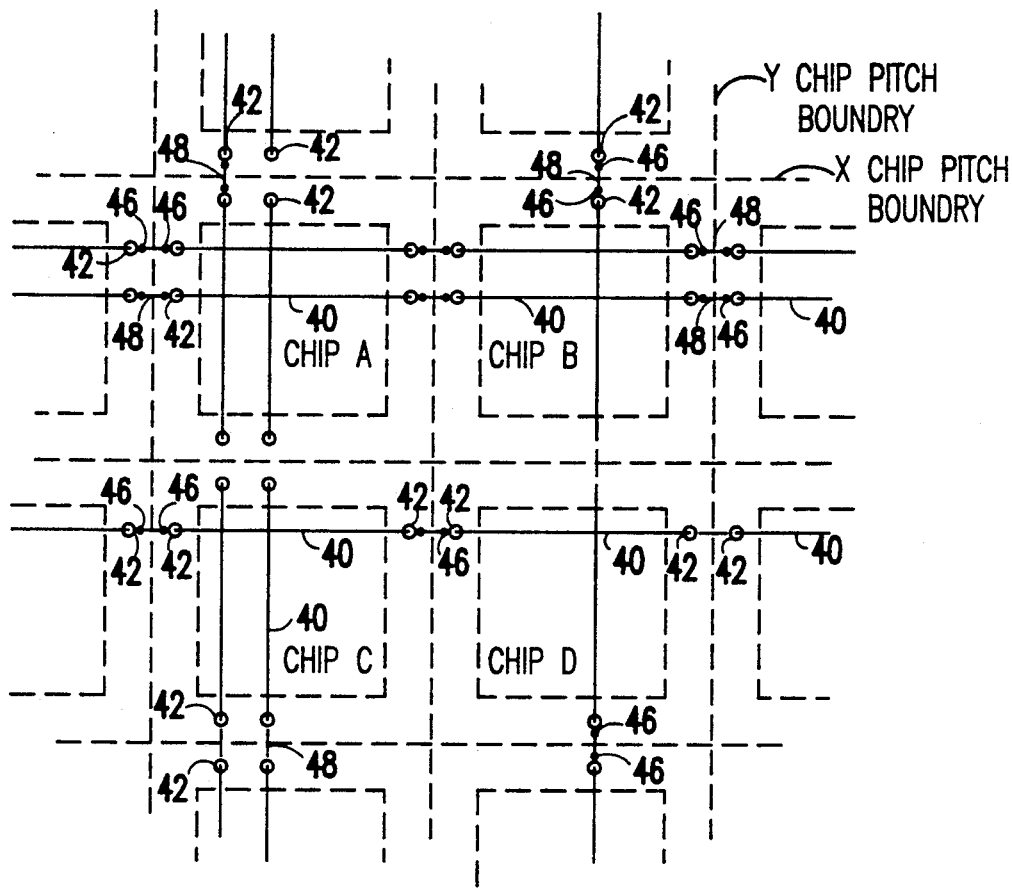
FIG. 3 is a schematic plan view illustrating, in a composite form, a portion of the engineering change wiring pattern on the thin-film X and thin-film Y wiring layers.

Referring now to FIG. 3 in addition to FIG. 2, FIG. 3 shows a few examples of the engineering wiring lines that run on the thin-film wiring layers 18 and 20. For convenience, both the X directed lines and the Y directed lines are shown in the same figure, although it will be appreciated that, in fact, the X and Y directed lines would be implemented in separate layers. The X directed engineering change wiring pattern on layer 18 comprises a number of parallel X directed line segments 40 (only three of which are shown in FIG. 3). Line segments 40 extends from a boundary on one side of a chip to a boundary on its opposite side and terminate at points indicated by reference numeral 42 located outside the chip boundary and inside the chip pitch boundary. Each of the terminal points 42 on the thin-film wiring layer 18 is connected by a via (not shown) to a corresponding point 42' on the top surface metal layer 14. A short-line segment 44 on the top surface metal layer 14 connects, respectively, each point 42' to a point 46' that is located within the same chip pitch boundary as the point 42' to which it is connected. A via (not shown) connects, respectively, each point 46' on the top surface metal layer 14 to a corresponding point 46 on the thin film layer 18. A short-line segment 48 on the thin-film layer 18 connects adjacent points 46 across a chip pitch boundary. Here it will be appreciated that the line segments 40 and 48 on thin-film layer 18, in combination with line segments 44 on the top surface metal 14, provide a global X direction network across the module to which a connection can be made by a direct write process to line segment 44 on the top surface metal layer. Similarly, any line in this global X direction network can be interrupted by laser deleting a portion of a line segment 44. It will be appreciated that the Y directed line segment patterns on both thin-film layer 20 and the top surface metal layer 14 are the same as that described for the X direction pattern and will not, therefore, be again described. The same reference numerals have been used for the Y direction components as for the corresponding X direction components in the drawings.

Figure 4:
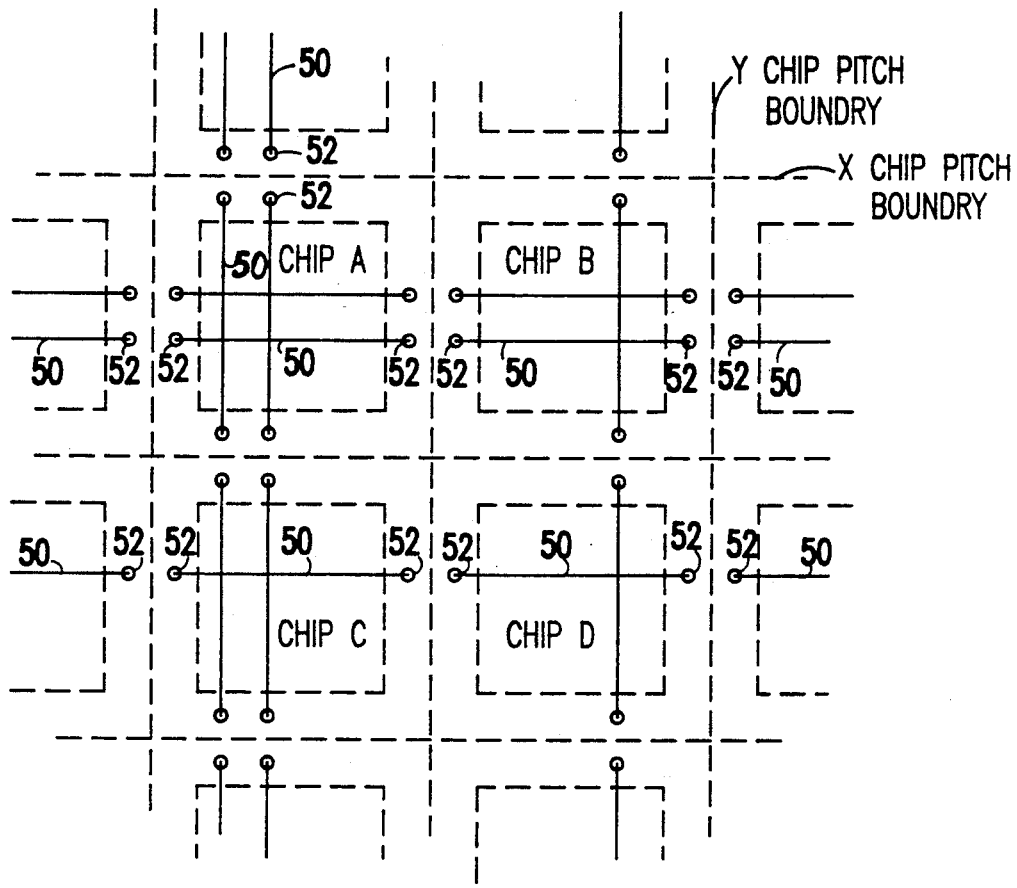
FIG. 4 is a schematic plan view illustrating, in a composite form, a portion of the engineering change wiring pattern on the MLC X and MLC Y layers.

Referring now to FIG. 4 in addition to FIG. 2, FIG. 4 shows several examples of the engineering wiring lines that run on the MLC layers 22 and 24. Again, for convenience, both the X directed lines and the Y directed lines are shown in the same figure although, in fact, they are on separate layers. The X directed engineering change wiring pattern on layer 22 comprises a number of parallel X directed line segments 50 (only three of which are shown in FIG. 4). Line segments 50 extend from outside a boundary on one side of a chip to outside a boundary on the opposite side of a chip. Each line 50 terminates at a point 52 that lies outside the chip boundary but within the chip pitch boundary. A via (not shown) connects each of the points 52 on the layer 22 to a corresponding point 52' on the top surface metal layer 14. A short line segment 56 of the top surface metal layer 14 connects adjacent points 52' across the chip pitch boundary. Again it will be appreciated that the line segments 50 on layer 22, in combination with the line segments 56 on the top surface metal layer 14, form a global X direction pattern of conductive lines covering the entire module. A connection can be made to a line in this pattern by a direct write connection to a line segment 56 on the top surface of the module. Similarly, a line can be interrupted by laser deleting a portion of a line segment 56. The Y directed pattern on layer 24, and its associated line segments in the top surface metal layer 14, are essentially the same as the X directed pattern already described, and the Y pattern will not be separately described. The same reference numerals have been used to denote the Y pattern components in FIGS. 2 and 4 as were used to denote corresponding X direction components.

Referring now to FIG. 2, the top surface metal layer 14 also has a pair of parallel line segments 57 and 58 located within the chip pitch boundary to provide a convenient means to change direction from an X directed engineering change line to a Y directed engineering change line and vice versa. These line segments 57 and 58 each ring the chip boundary and are periodically interrupted by the line segments 56. Vias connects adjacent ends of line segments 57 to a small connecting segment on the second metal layer 16 so that the line segments 57 form a continuous conductive ring. Similarly, vias connect the ends of line segments 58 to a small connecting segment on the metal layer 16 so that segments 58 also form a continuous conductive ring. Although the small connecting segments on layer 16 interrupt this reference metal layer, since the dimension of the segment is small, they have an insignificant affect on its impedance.

A small pad 60 is located between the parallel segments 57 and 58 and on a line between adjacent points 42'. A via connects each of the pads 60 to a line segment 48 on the thin-film layer 18 if the pad 60 is located on an X direction border, and to a line segment 48 on the thin-film layer 20 if the pad 60 is located on a Y direction border.

In order to provide a convenient engineering change wiring path from each of the pads 34 to a point outside the chip boundary, the top surface metal layer 14 is an X directed pattern of conductive line segments 66 for each horizontal row of pads 34, and a similar Y directed pattern of conductive line segments 68 for each vertical column of pads 34. It will be appreciated from an inspection of FIG. 2 that each pad 34 is surrounded by these line segments and that the line segments that extend beyond the chip boundary are located midway between points 42' connected to the thin-film layers 18 or 20 and the points 52' connected to the layers 26 and 28.

Figure 5:
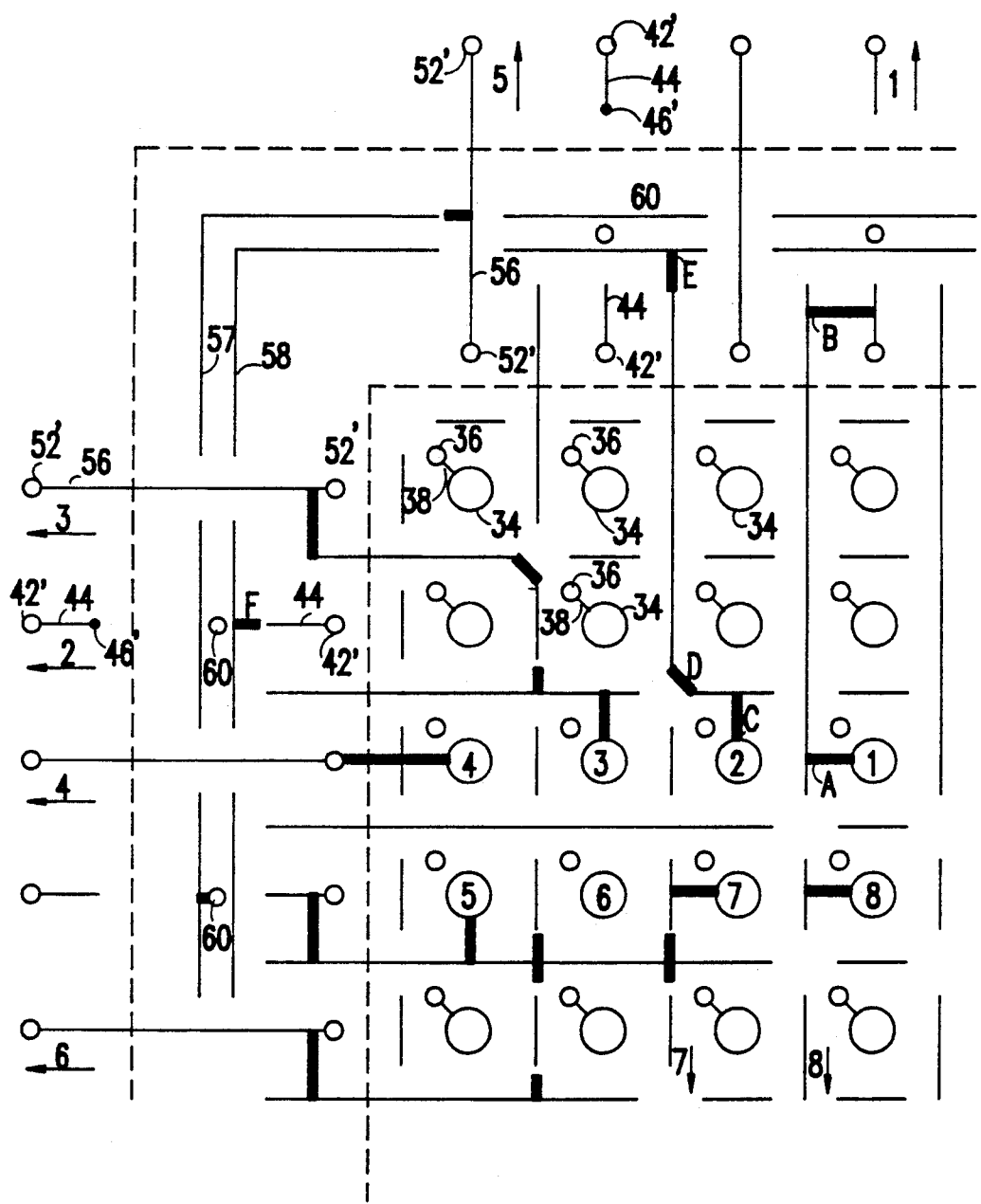
FIG. 5 is a view similar to FIG. 2, illustrating rerouting of a wiring pattern in order to accomplish desired engineering changes.

FIG. 5 is an illustrative example of how, using short direct write wire segments in combination with laser deletions, engineering changes can be made in accordance with the teachings of this invention. FIG. 5 shows examples of rerouted wiring networks from eight adjacent pads marked 1 through 8 in the drawing to correspondingly mark points along the chip pitch boundary. In each case the line 38 between pad 34 and its associated pad 36 has been laser deleted.

Each pad to be rerouted in accordance with an engineering change is first connected to a point outside the chip boundary by means of a series of direct write segments and the line segments 66 and/or 68. A direct write segment A connects pad 1 to a Y directed segment 68 that extends beyond the chip border. Another direct write segment B connects that line segment 68 to a Y directed segment 44 at the top of FIG. 5. So that the connection will be in the direction of the arrow, the corresponding segment 44 on the oppsite side of the chip is open circuited by laser deleting a portion of the segment.

Direct write line segment C connects pad 2 to an X directed segment 66 and this segment 66 is connected to a Y directed segment 68 by means of another direct write segment D. This segment 68 extends beyond the chip border and direct write segment E connects it to the inner change ring 58. A portion of the change ring to the right of the connection is laser deleted so that a connection is made in a counter clockwise direction to point F where the change ring 58 is connected to an X directed line segment 44. The network is directed in the direction of the arrow by deleting a portion of the line segment 44 on the opposite side of the chip. The engineering change pattern for pads numbered 3 through 8 are self explanitory from an inspection of the drawing.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An engineering change network for a multi-chip, multi-layer module, comprising in combination:
   a top surface metal layer including plurality of C4 pads for connecting a chip to said multi-chip module and a satellite pad located adjacent each of said plurality of C4 pads and connected to a C4 pad by a short deleteable line segment;

said top surface metal layer including a plurality of interrupted line segments arranged in rows and columns so that at least one of said interrupted line segments passes in close proximity to each C4 pad of said plurality of C4 pads, said row and columns of said interrupted line segments extending beyond a chip boundary and terminating within a chip pitch boundary;

a global engineering change wiring pattern comprised of parallel X directed interrupted segments on a buried layer in said multi-layer module connected to top surface metal X direction global segments that connect said interrupted segments, said top surface metal X direction global segments disposed between said chip boundary and said chip pitch boundary; and a global engineering change wiring pattern comprised of parallel Y directed interrupted segments on a buried layer in said multi-layer module connected to top surface metal Y direction global segments that connect said interrupted segments, said top surface metal Y direction global segments disposed between said chip boundary and said chip pitch boundary.

2. An engineering change network for a multi-chip, multi-layer module, comprising in combination:

a top surface metal layer including plurality of C4 pads for connecting a chip to said multi-chip module and a satellite pad located adjacent each of said plurality of C4 pads and connected to a C4 pad by a short deleteable line segment;

said top surface metal layer including a plurality of interrupted line segments arranged in rows and columns so that at least one of said interrupted line segments passes in close proximity to each C4 pad of said plurality of C4 pads, said row and columns of said interrupted line segments extending beyond a chip boundary and terminating within a chip pitch boundary;

a first global engineering change wiring pattern comprised of parallel X directed interrupted segments on a first buried layer in said multi-layer module connected to top surface metal X direction global segments that connect said interrupted segments, said top surface metal X direction global segments disposed between said chip boundary and said chip pitch boundary;

a second global engineering change wiring pattern comprised of parallel Y directed interrupted segments on a second buried layer in said multi-layer module connected to top surface metal Y direction global segments that connect said interrupted segments, said top surface metal Y direction global segments disposed between said chip boundary and said chip pitch boundary;

a third global engineering change wiring pattern comprised of parallel X directed interrupted segments on a third buried layer in said multi-layer module connected to top surface metal X direction global segments that connect said interrupted segments, said top surface metal X direction global segments disposed between said chip boundary and said chip pitch boundary; and a fourth global engineering change wiring pattern comprised of parallel Y directed interrupted segments on a fourth buried layer in said multi-layer module connected to top surface metal Y direction global segments that connect said interrupted segments, said top surface metal Y direction global segments disposed between said chip boundary and said chip pitch boundary.

3. An engineering change network for a multi-chip, multi-layer module as in claim 2, wherein said first and second buried layers are thin-film layers and said third and fourth layers are MLC layers.

4. An engineering change network for a multi-chip, multi-layer module as in claim 1, wherein said top surface metal layer further includes a pair of direction changing lines that surround said plurality of C4 pads, said direction changing lines located outside said chip boundary and inside said chip pitch boundary.

5. An engineering change network for a multi-chip, multi-layer module as in claim 2, wherein said top surface metal layer further includes a pair of direction changing lines that surround said plurality of C4 pads, said direction changing lines located outside said chip boundary and inside said chip pitch boundary.

* * * * *